(12) United States Patent
Ishikawa

(10) Patent No.: US 7,816,949 B2
(45) Date of Patent: Oct. 19, 2010

(54) SIGNAL TRANSMISSION CIRCUIT AND SIGNAL TRANSMISSION SYSTEM USING THE SAME

(75) Inventor: Toru Ishikawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/379,289

(22) Filed: Feb. 18, 2009

(65) Prior Publication Data
US 2009/0206879 A1  Aug. 20, 2009

(30) Foreign Application Priority Data
Feb. 19, 2008  (JP)  .............................. 2008-038081

(51) Int. Cl.
   *H03K 19/094* (2006.01)
(52) U.S. Cl. ............................ 326/86; 326/30; 327/109; 330/253; 330/254
(58) Field of Classification Search ............. 326/82–83, 326/86; 327/108–109; 330/252–254
See application file for complete search history.

(56) References Cited

U.S. PATENT DOCUMENTS

| | | | | | |
|---|---|---|---|---|---|
| 3,603,894 | A | * | 9/1971 | Cecchin et al. ............. | 330/261 |
| 4,794,342 | A | * | 12/1988 | Kimura ......................... | 330/2 |
| 4,800,303 | A | * | 1/1989 | Graham et al. ................ | 326/72 |
| 5,467,046 | A | * | 11/1995 | Kimura ....................... | 327/351 |
| 5,506,537 | A | * | 4/1996 | Kimura ....................... | 327/351 |
| 6,208,161 | B1 | * | 3/2001 | Suda ............................ | 326/30 |
| 6,252,454 | B1 | * | 6/2001 | Thompson et al. ............. | 330/9 |
| 6,313,704 | B1 | * | 11/2001 | Maruyama et al. .......... | 330/259 |
| 6,831,510 | B2 | * | 12/2004 | Jiang ........................... | 330/85 |
| 7,212,041 | B2 | * | 5/2007 | Kazemi-Nia .................. | 327/58 |
| 7,443,201 | B2 | * | 10/2008 | Koo ........................... | 326/82 |
| 2003/0134608 | A1 | * | 7/2003 | Matsumoto et al. ....... | 455/226.2 |
| 2006/0061415 | A1 | * | 3/2006 | Bhattacharjee et al. ...... | 327/563 |
| 2006/0132179 | A1 | | 6/2006 | Kim | |

FOREIGN PATENT DOCUMENTS

| | | |
|---|---|---|
| JP | 2006-174488 | 6/2006 |
| JP | 2006-340340 | 12/2006 |

* cited by examiner

*Primary Examiner*—James H. Cho
*Assistant Examiner*—Jason Crawford
(74) *Attorney, Agent, or Firm*—McGinn IP Law Group, PLLC

(57) ABSTRACT

A signal transmission circuit includes first and second power source wirings, and a plurality of differential circuits connected in series between the first and second power source wirings. A signal transmission system includes a plurality of pairs of signal wirings, an output circuit supplying a differential signal to each of the pairs of signal wirings, and an input circuit receiving the differential signals via the pairs of signal wirings, wherein the output circuit includes first and second power source wirings, and a plurality of differential output circuits connected in series between the first and second power source wirings, and the input circuit includes a plurality of differential input circuits respectively corresponding to the differential output circuits.

20 Claims, 16 Drawing Sheets

SIGNAL TRANSMISSION CIRCUIT AND SIGNAL TRANSMISSION SYSTEM USING THE SAME

BACKGROUND OF THE INVENTION

1. Field of the Invention

The present invention relates to a signal transmission circuit and a signal transmission system using the same, and, more particularly relates to a signal transmission circuit using a differential circuit and a signal transmission system using the signal transmission circuit.

2. Description of Related Art

In a signal transmission system using a semiconductor device, a signal transmission is usually performed by a single end system. The single end system is a system of transmitting information using one signal line, and the number of signal lines can be reduced. However, the single end system can be easily influenced by noise, and requires a certain level of signal amplitude. Therefore, this can easily become a noise generation source. Accordingly, when a higher data-transmission rate is required, a differential transmission system is often used. The differential transmission system is a system of transmitting a complementary signal using a pair of signal wirings, and can transmit signals in smaller amplitude.

FIG. 16A is a circuit diagram of a general signal transmission circuit using a differential output circuit, and FIG. 16B is an output waveform diagram thereof.

The signal transmission circuit shown in FIG. 16A includes a differential output circuit 2 and a constant current source 4 connected in series between a power source wiring to which a power source potential Vterm is supplied and a power source wiring to which a ground potential GND is supplied. The differential output circuit 2 includes an input transistor T1 that receives one complementary input signal (D) to a gate electrode out of a pair of complementary input signals, an input transistor T2 that receives the other complementary input signal (DB) to a gate electrode, an output resistor R1 connected in series to the input transistor T1, and an output resistor R2 connected in series to the input transistor T2. One complementary output signal (Out) is output from a connection point between the input transistor T1 and the output resistor R1 out of a pair of complementary output signals, and the other complementary output signal (OutB) is output from a connection point between the input transistor T2 and the output resistor R2. A bias voltage Bias is supplied to a gate electrode of a transistor constituting the constant current source 4.

The input signals D/DB supplied to the input transistors T1 and T2 are complementary signals. Therefore, when one of the input transistors T1 and T2 is turned on, the other transistor is turned off. Accordingly, a current I generated by the constant current source 4 flows to one of the output resistors R1 and R2. Consequently, the output signals Out/OutB also become complementary signals. FIG. 16B shows a waveform of the output signals Out/OutB. One of these output signals becomes at substantially the same potential as the power source potential Vterm, and the other output signal becomes at a potential dropped by ΔV from the power source potential Vterm. The potential drop ΔV corresponds to a voltage dropped based on the output resistor R1 or R2. When a resistance of the output resistors R1 and R2 is R, the potential drop ΔV is defined as R×I. When the resistance R of the output resistors R1 and R2 is set to 50Ω and also when a constant current I is set to 4 mA, for example, this ΔV becomes 200 mV.

As explained with reference to FIG. 16A, one of the input transistors T1 and T2 constituting the differential output circuit is in the on state without exception. That is, a current is always flowing, not like the current flowing only at timing when a logic level of the signal changes in the single end system. Therefore, power consumed by one differential output circuit is given by Vterm×I regardless of a data transmission rate. When N differential output circuits are provided, power consumption is expressed as N×Vterm×I.

As described above, a conventional signal transmission circuit using a differential output circuit has a problem of power consumption increase in proportion to the number of differential output circuits.

SUMMARY

In one embodiment, there is provided a signal transmission circuit includes first and second power source wirings, and a plurality of differential circuits connected in series between the first and second power source wirings.

According to the present invention, plural differential circuits connected in series share a current flowing between the first and second power source wirings. Because the plural differential circuits can be operated using power that one differential circuit conventionally consumes, total power consumption can be substantially decreased. A detailed circuit configuration of the differential circuits is not particularly limited in the present invention. The differential circuits can be differential output circuits or differential input circuits. Preferably, a signal transmission circuit according to the present invention is applied to an output buffer to output data to another semiconductor chip. However, the present invention is not limited thereto, and can be also applied to a signal transmission circuit inside a semiconductor chip.

In another embodiment, there is provided a signal transmission system includes a plurality of pairs of signal wirings, an output circuit supplying a differential signal to each of the pairs of signal wirings, and an input circuit receiving the differential signals via the pairs of signal wirings, wherein the output circuit includes first and second power source wirings, and a plurality of differential output circuits connected in series between the first and second power source wirings, and the input circuit includes a plurality of differential input circuits respectively corresponding to the differential output circuits.

According to the present invention, plural differential circuits constituting an output circuit share a current flowing between first and second power source wirings. Therefore, power consumption of the output circuit can be substantially decreased. In the present invention, it is preferable that the output circuit is provided in a first semiconductor chip, and that an input circuit is provided in a second semiconductor chip different from the first semiconductor chip. This is for the following reason. According to a signal transmission between different semiconductor chips, a large current flows as compared with a current in a signal transmission inside a semiconductor chip. Therefore, when the present invention is applied to an interface portion with another chip, a better effect of reduction in power consumption can be obtained.

As described above, according to the present invention, power consumption in a signal transmission circuit of a dif-
} ferential transmission system and in a signal transmission system using this signal transmission circuit can be substantially decreased.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1A:
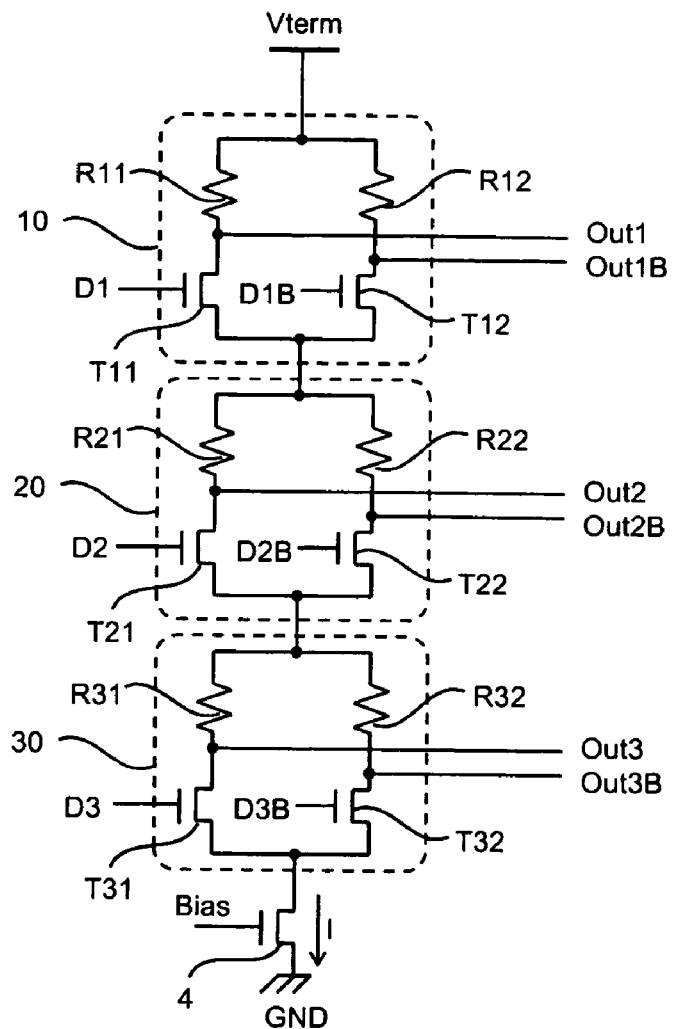
FIG. 1A is a circuit diagram of a signal transmission circuit according to a first embodiment of the present invention.
Figure 1B:
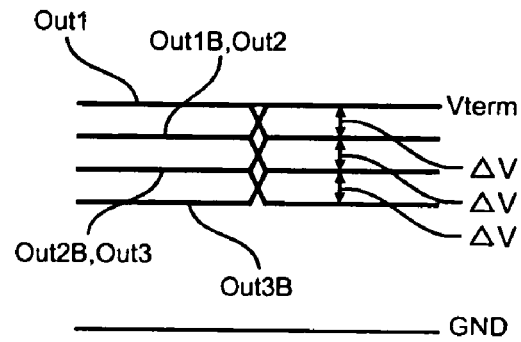
FIG. 1B is an output waveform diagram thereof.

FIG. 1A is a circuit diagram of a signal transmission circuit according to a first embodiment of the present invention, and FIG. 1B is an output waveform diagram thereof.

As shown in FIG. 1A, the signal transmission circuit according to the first embodiment includes differential output circuits 10, 20, and 30 and the constant current source 4 connected in series between a power source wiring to which the power source potential Vterm is supplied and a power source wiring to which the ground potential GND is supplied. These differential output circuits 10, 20, and 30 have mutually the same circuit configurations, and include input transistors T11, T21, and T31 that receive one complementary input signals (D1, D2, D3) to their respective gate electrodes, the input transistors T12, T22, and T32 that receive the other complementary input signals (D1B, D2B, D3B) to their respective gate electrodes, output resistors R11 and R21, and R31 connected in series, respectively to the input transistors T11, T21, and T31, and output resistors R12, R22, and R32 connected in series, respectively to the input transistors T12, T22, and T32. These input transistors are all N-channel MOS transistors.

The differential output circuit 10 outputs one of complementary output signals (Out1) from a connection point between the input transistor T11 and the output resistor R11, and outputs the other complementary output signal (Out1B) from a connection point between the input transistor T12 and the output resistor R12. Similarly, the differential output circuit 20 outputs one of complementary output signals (Out2) from a connection point between the input transistor T21 and the output resistor R21, and outputs the other complementary output signal (Out2B) from a connection point between the input transistor T22 and the output resistor R22. The differential output circuit 30 outputs one of complementary output signals (Out3) from a connection point between the input transistor T31 and the output resistor R31, and outputs the other complementary output signal (Out3B) from a connection point between the input transistor T32 and the output resistor R32.

The input signals D1/D1B, D2/D2B, and D3/D3B are mutually complementary signals. Therefore, in the differential output circuit 10, one of the input transistors T11 and T12 becomes on, and the other one becomes off. In the differential output circuit 20, one of the input transistors T21 and T22 becomes on, and the other one becomes off. In the differential output circuit 30, one of the input transistors T31 and T32 becomes on, and the other one becomes off.

The bias voltage Bias is supplied to a gate electrode of a transistor constituting the constant current source 4. Therefore, a current I generated by the constant current source 4 flows through one of the output resistors R11 and R12, one of the output resistors R21 and R22, and one of the output resistors R31 and R32, respectively. That is, one constant current source 4 is shared by the three differential output circuits 10, 20, and 30. The current I used to operate the differential output circuit 10 is used again to operate the differential output circuit 20. Further, the current I used to operate the differential output circuit 20 is used again to operate the differential output circuit 30.

Figure 16A:
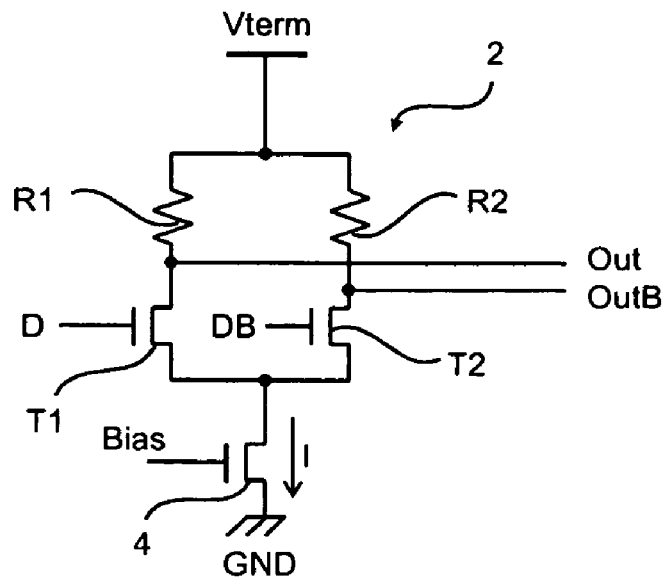
FIG. 16A is a circuit diagram of a general signal transmission circuit using a differential output circuit.
Figure 16B:
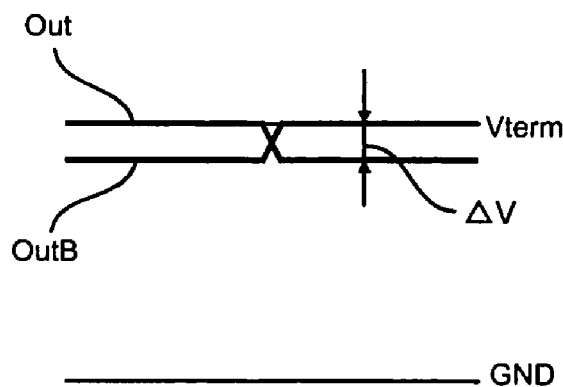
FIG. 16B is an output waveform diagram thereof.

As a result, as shown in FIG. 1B, one of the output signals Out1/Out1B output from the differential output circuit 10 becomes at substantially the same potential as the power source potential Vterm, and the other one becomes at a potential dropped by $\Delta V$ from the power source potential Vterm, in the same manner as that in the conventional circuit (see FIG. 16). On the other hand, when an on-resistance of the input transistor is regarded as sufficiently low, the output signals Out2/Out2B output from the differential output circuit 20 become at a potential dropped by ΔV from the potentials of the output signals Out1/Out1B. The output signals Out3/Out3B output from the differential output circuit 30 become at a potential further dropped by ΔV from the potentials of the output signals Out2/Out2B. That is, center levels of the output signals shift by ΔV, respectively. The potential drop ΔV corresponds to a voltage drop based on each output resistor. When a resistance of each output resistor is R, the ΔV can be defined as R×I.

When Vterm is 1.5 V and also when ΔV is 200 mV for example, the output signals Out1/Out1B swing between 1.3 V and 1.5 V, the output signals Out2/Out2B swing between 1.1 V and 1.3 V, and the output signals Out3/Out3B swing between 0.9 V and 1.1 V.

As described above, although the center level of each output signal is deviated by ΔV, the differential transmission system can correctly perform a transmission when a significant potential difference is generated between the complementary signals. Therefore, even when the center levels of the output signals Out2/Out2B and the center levels of the output signals Out3/Out3B are low, the input circuit that receives these signals can correctly reproduce the data.

As described above, in the signal transmission circuit according to the first embodiment, the three differential output circuits 10, 20, and 30 are connected in series. Therefore, the three differential output circuits 10, 20, and 30 can be operated by power consumption of Vterm×I. In the conventional signal transmission circuit, power consumption of 3×Vterm×I is necessary to operate the three differential output circuits. According to the first embodiment, total power consumption can be decreased to ⅓.

Further, because two input transistors are included in each of the differential output circuits 10, 20, and 30 in the signal transmission circuit according to the first embodiment, the signal transmission circuit can be configured using a small number of transistors. The "number of transistors" in this case means the number when plural transistors connected in parallel are regarded as one. Therefore, when plural transistors are connected in parallel to adjust impedance, the total of these plural transistors connected in parallel is regarded as one transistor.

Figure 2:
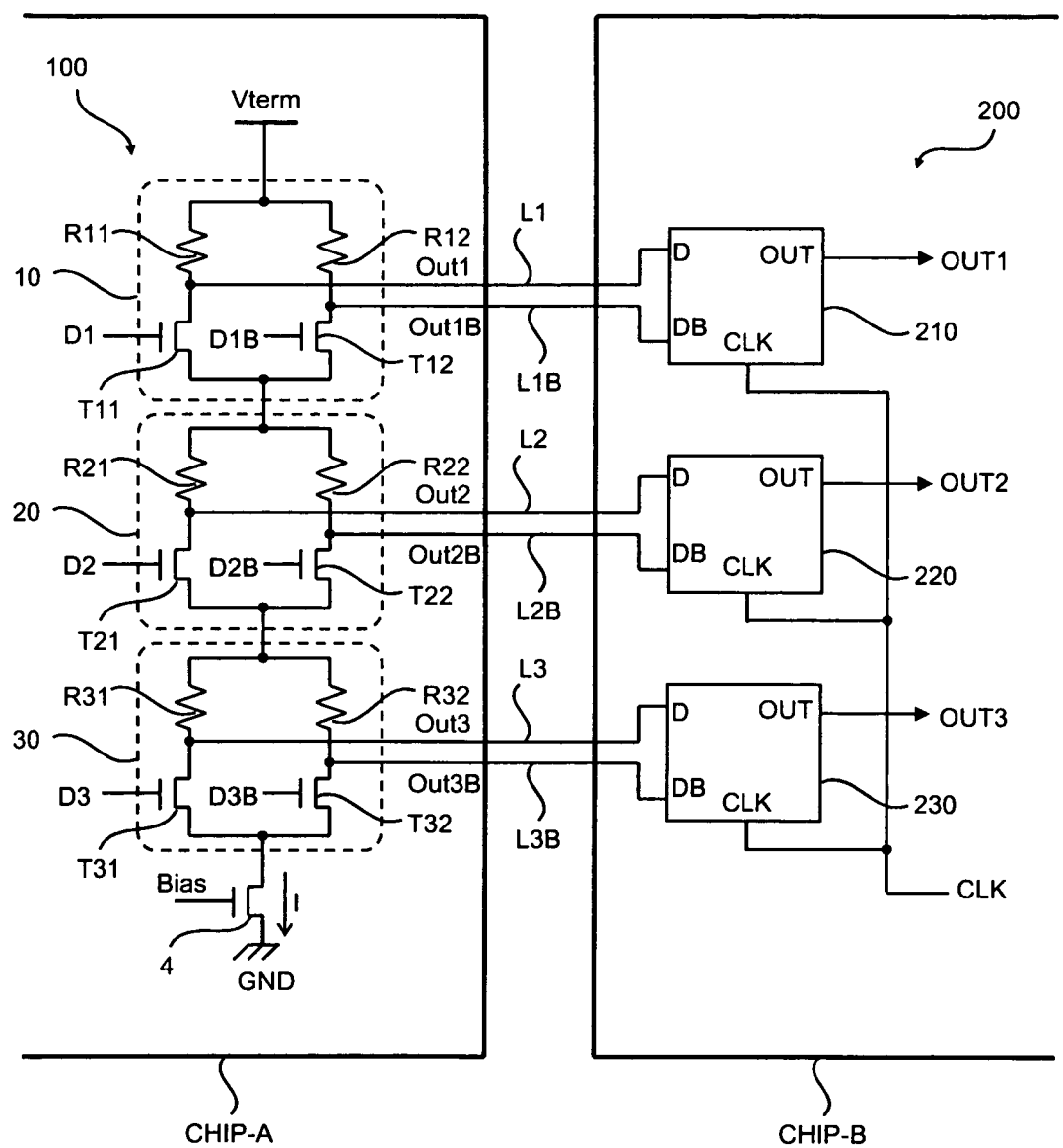
FIG. 2 is a circuit diagram showing one example of a signal transmission system using the signal transmission circuit according to the first embodiment.

FIG. 2 is a circuit diagram showing one example of a signal transmission system using the signal transmission circuit according to the first embodiment.

The signal transmission system shown in FIG. 2 includes three pairs of signal wirings L1/L1B, L2/L2B, and L3/L3B, an output circuit 100 that supplies a differential signal to each of these signal wirings, and an input circuit 200 that receives the differential signal via these signal wirings. The output circuit 100 is provided in a semiconductor chip CHIP-A, and the input circuit 200 is provided in a separate semiconductor chip CHIP-B. Therefore, the signal wirings L1/L1B, L2/L2B, and L3/L3B are external wirings connecting between the semiconductor chip CHIP-A and the semiconductor chip CHIP-B. The output circuit 100 is an output buffer outputting signals of a complementary format to the external wirings. The input circuit 200 is an input receiver that receives signals of a complementary format supplied via the external wirings.

The output circuit 100 provided in the semiconductor chip CHIP-A has the same circuit configuration as that of the signal transmission circuit shown in FIG. 1. A larger current flows in a signal transmission between different semiconductor chips than a signal flowing in a signal transmission inside a semiconductor chip. Therefore, when the signal transmission circuit shown in FIG. 1 is used in an interface portion (an output buffer) with other chips like this, the effect of decreasing power consumption is further improved.

On the other hand, the input circuit 200 provided in the semiconductor chip CHIP-B includes three differential input circuits 210, 220, and 230 corresponding to the three differential input circuits 10, 20, and 30, respectively. The differential input circuits 210, 220, and 230 receive the output signals Out1/Out1B, Out2/Out2B, and Out3/Out3B of a differential format, respectively, and convert these signals into the internal signals OUT1, OUT2, and OUT3 of a single-end system, respectively. The internal signals OUT1, OUT2, and OUT3 are used as internal signals of the semiconductor chip CHIP-B.

Figure 3A:
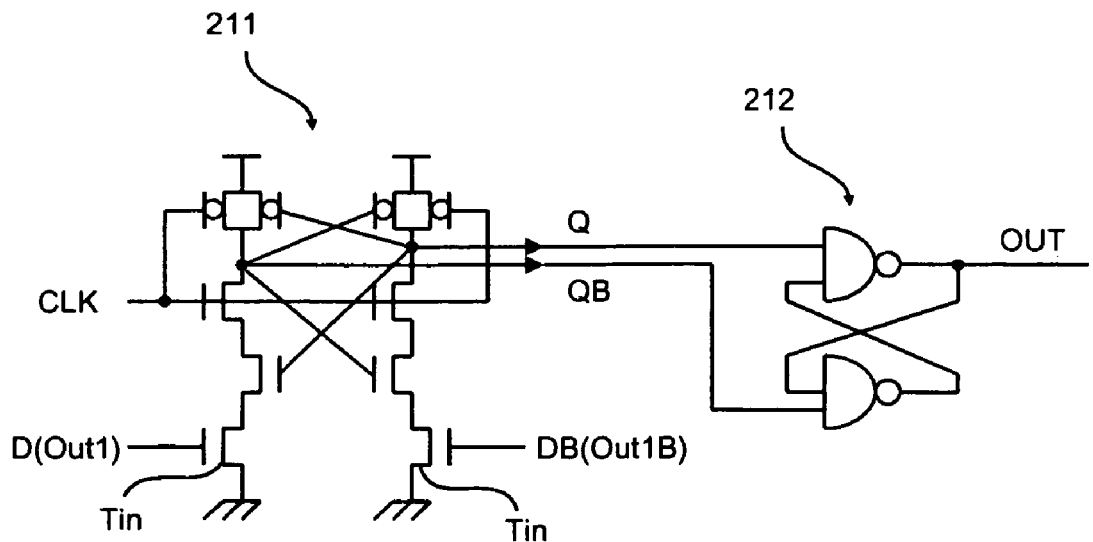
FIG. 3A is a circuit diagram of the differential input circuit 210.
Figure 3B:
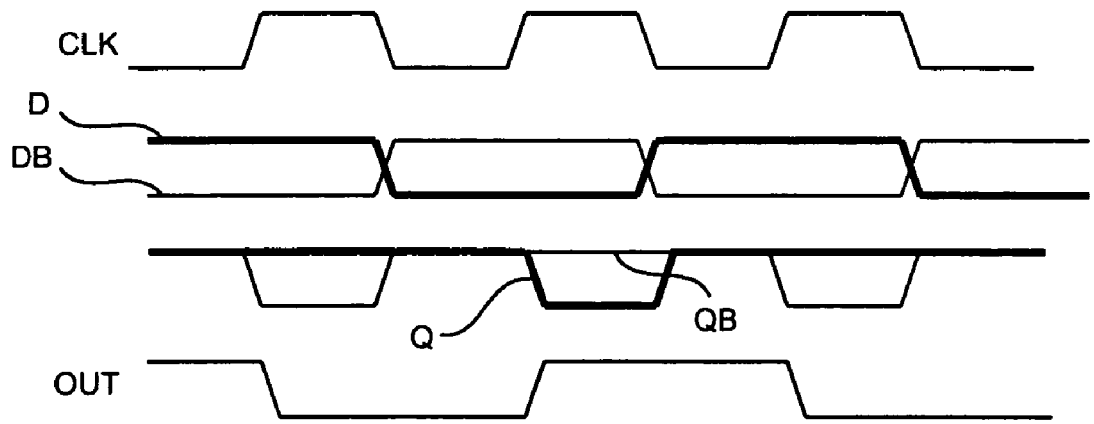
FIG. 3B is an operation waveform diagram thereof.

FIG. 3A is a circuit diagram of the differential input circuit 210, and FIG. 3B is an operation waveform diagram thereof. Other differential input circuits 220 and 230 also have the same circuit configurations as that of the differential input circuit 210 shown in FIG. 3A.

As shown in FIG. 3A, the differential input circuit 210 includes a differential sense amplifier 211 performing a sensing operation synchronously with a clock signal CLK, and a latch circuit 212 generating an internal signal QUT1 of a single-end system by latching outputs Q/QB of the differential sense amplifier 211. As shown in FIG. 3B, the differential sense amplifier 211 senses the input signals (Out1/Out1B) supplied from complementary input terminals D/DB, synchronously with a rising edge of the clock signal CLK.

The sensing operation is performed when a significant potential difference is present in the complementary signals supplied from the input terminals D/DB, and their center level have a sufficient margin. Specifically, as shown in FIG. 3A, when input transistors Tin connected to the input terminals D/DB are N-channel MOS transistors, and also when a level VIL of a signal at a lower potential out of the complementary input signals (Out1/Out1B) is equal to or higher than a threshold voltage Vt of the input transistor Tins, the differential sense amplifier 211 can sense the input signals. Therefore, when this differential sense amplifier 211 is used, this differential sense amplifier can correctly sense the complementary signals of which center levels shift (become low).

Figure 4:
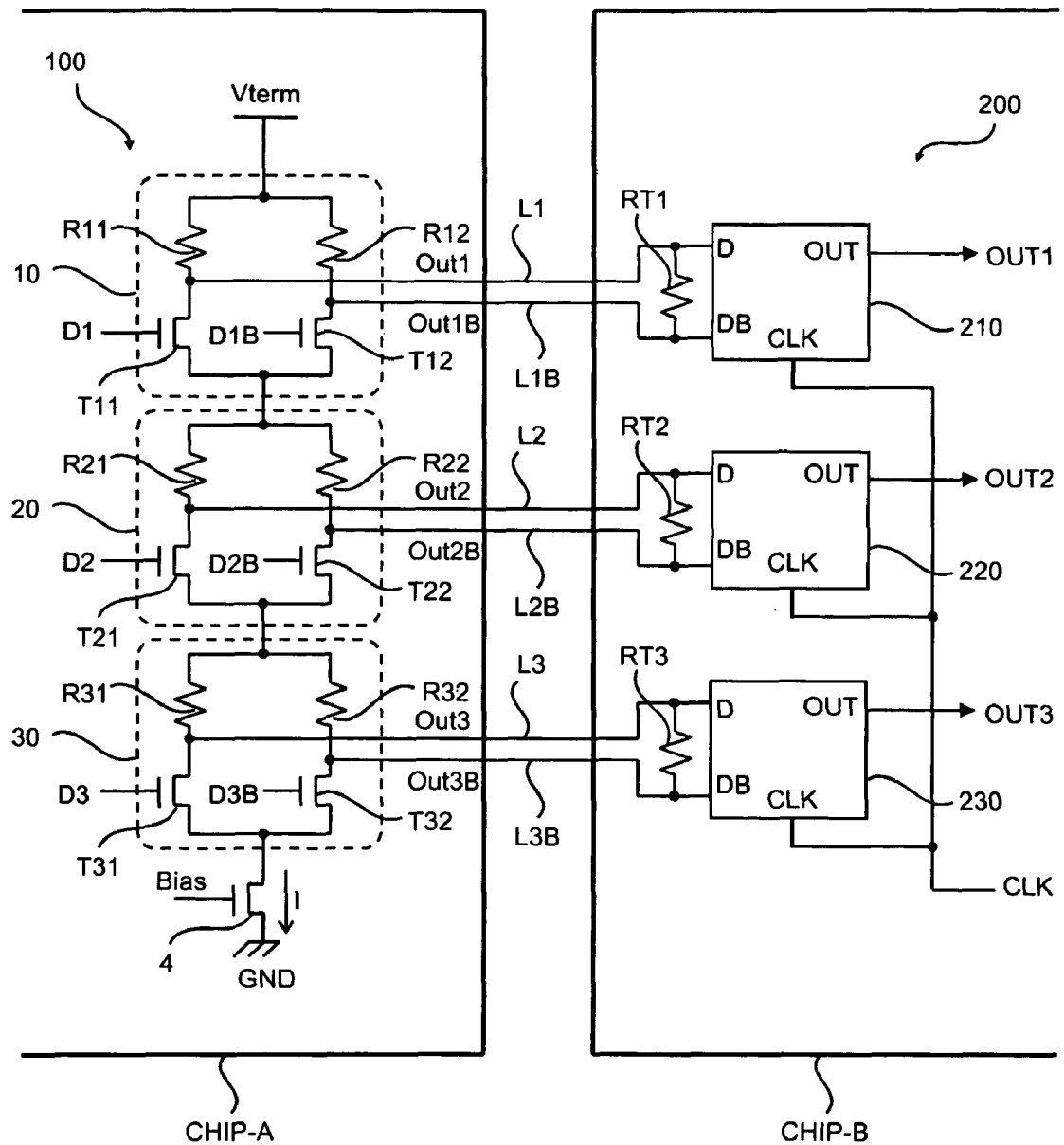
FIG. 4 is a circuit diagram showing another example of a signal transmission system using the signal transmission circuit according to the first embodiment.

FIG. 4 is a circuit diagram showing another example of a signal transmission system using the signal transmission circuit according to the first embodiment.

The signal transmission system shown in FIG. 4 is different from the signal transmission system shown in FIG. 2 in that terminal resistors RT1, RT2, and RT3 are added to the input circuit 200. Other features of the signal transmission system shown in FIG. 4 are the same as those of the signal transmission system shown in FIG. 2, and therefore identical elements are assigned with like reference numerals, and redundant explanations thereof will be omitted.

As shown in FIG. 4, the terminal resistors RT1, RT2, and RT3 are connected between the pair of signal wirings L1/L1B, between the pair of signal wirings L2/L2B, and between the pair of signal wirings L3/L3B, respectively. In this example, while the terminal resistors RT1, RT2, and RT3 are provided inside the semiconductor chip CHIP-B, the position is not limited thereto. These terminal resistors can be provided in another position, such as at the outside of the semiconductor chip CHIP-B.

When the terminal resistors RT1, RT2, and RT3 are added, reflection of signals at the input circuit 200 side can be decreased. Therefore, the signal quality can be improved.

Figure 5:
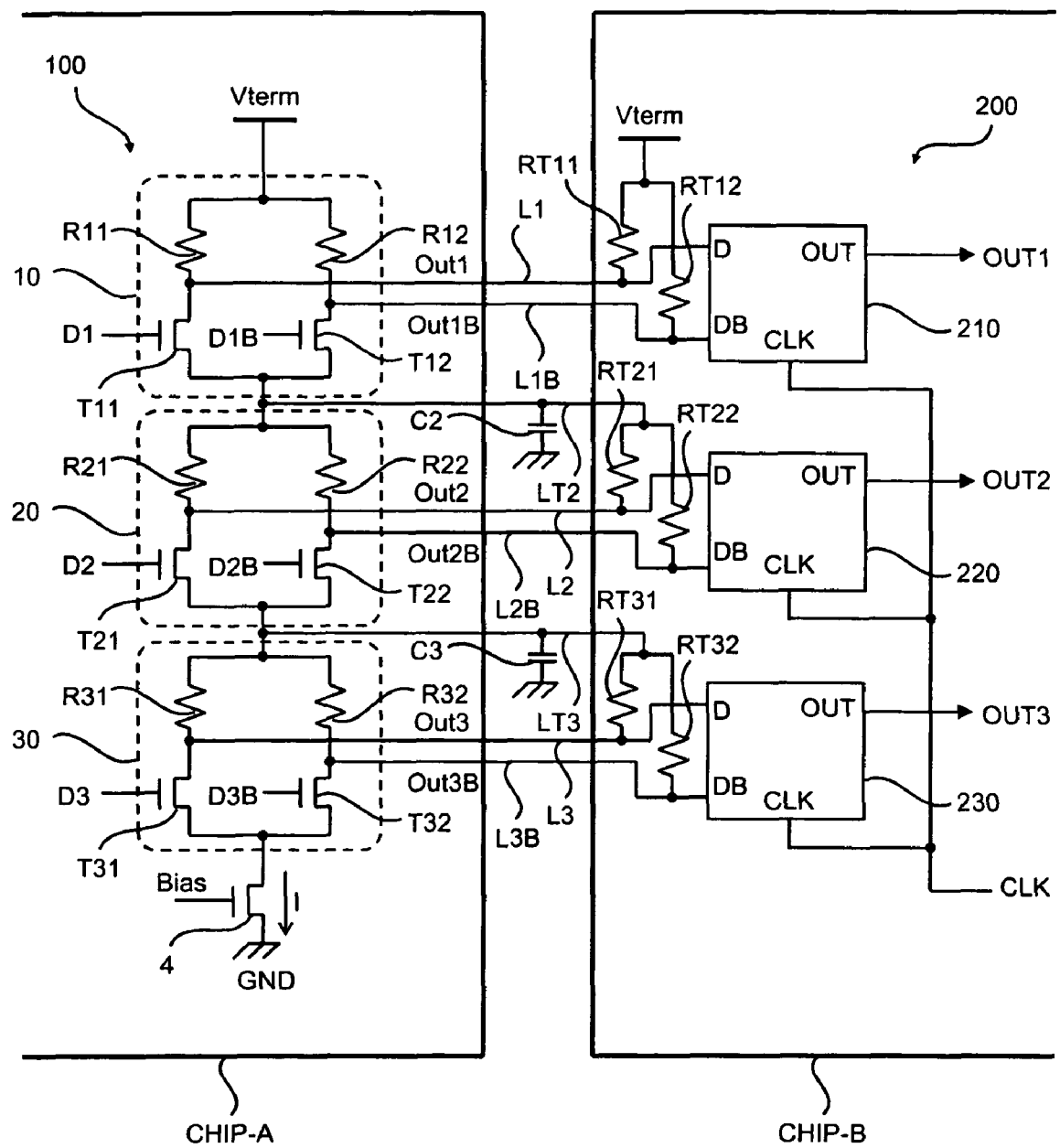
FIG. 5 is a circuit diagram showing still another example of a signal transmission system using the signal transmission circuit according to the first embodiment.

FIG. 5 is a circuit diagram showing still another example of a signal transmission system using the signal transmission circuit according to the first embodiment.

The signal transmission system shown in FIG. 5 is different from the signal transmission system shown in FIG. 2 in that terminal resistors RT11, RT12, RT21, RT22, RT31, and RT32 are added to the input circuit 200. As shown in FIG. 5, each one end of the terminal resistors RT11 and RT12 is connected to the power source potential Vterm, and each other end is connected to the signal wirings L1 and L1B, respectively.

On the other hand, each one end of the terminal resistors RT21 and RT22 is connected to a connection point between the differential output circuit 10 and the differential output circuit 20 via the wiring LT2, and each other end is connected to the signal wirings L2 and L2B, respectively. Similarly, each one end of the terminal resistors RT31 and RT32 is connected to a connection point between the differential output circuit 20 and the differential output circuit 30 via the wiring LT3, and each other end is connected to the signal wirings L3 and L3B, respectively. In this way, the terminal resistors RT21, RT22, RT31, and RT32 are connected between a corresponding signal wiring and a corresponding connection point between the differential output circuits, respectively.

Further, as shown in FIG. 5, capacitors C2 and C3 are connected to the wirings LT2 and LT3, respectively to stabilize a potential. Other features of the signal transmission system shown in FIG. 5 are the same as those of the signal transmission system shown in FIG. 2, and therefore identical elements are assigned with like reference numerals, and redundant explanations thereof will be omitted. In this example, while the terminal resistors RT11, RT12, RT21, RT22, RT31, and RT32 are also provided inside the semiconductor chip CHIP-B, these terminal resistors can be provided at the outside of the semiconductor chip CHIP-B. In this example, while the capacitors C2 and C3 are provided at the outside of the semiconductor chips. CHIP-A and CHIP-B, these capacitors can be provided inside the semiconductor chips CHIP-A and CHIP-B, respectively. Alternatively, the capacitors C2 and C3 can be omitted.

When these terminal resistors RT11, RT12, RT21, RT22, RT31, and RT32 are added, reflection of signals at the input circuit 200 side can be decreased. Therefore, the signal quality can be improved.

In this example, the same potential is not applied to each of the terminal resistors RT11, RT12, RT21, RT22, RT31, and RT32, but a corresponding potential is applied to each terminal resistor. Specifically, the power source potential Vterm is applied to the terminal resistors RT11 and RT12, Vterm-Δ is applied to the terminal resistors RT21 and RT22, and Vterm-2×ΔV is applied to the terminal resistors RT31 and RT32. These potentials are substantially the same as a higher level potential of the corresponding output signals Out1/Out1B, Out2/Out2B, and Out3/Out3B. Therefore, a current does not flow from the output circuit 100 via the terminal resistors RT11, RT12, RT21, RT22, RT31, and RT32. Consequently, the presence of these terminal resistors does not affect each output level of the output signals Out1/Out1B, Out2/Out2B, and Out3/Out3B.

Figure 6:
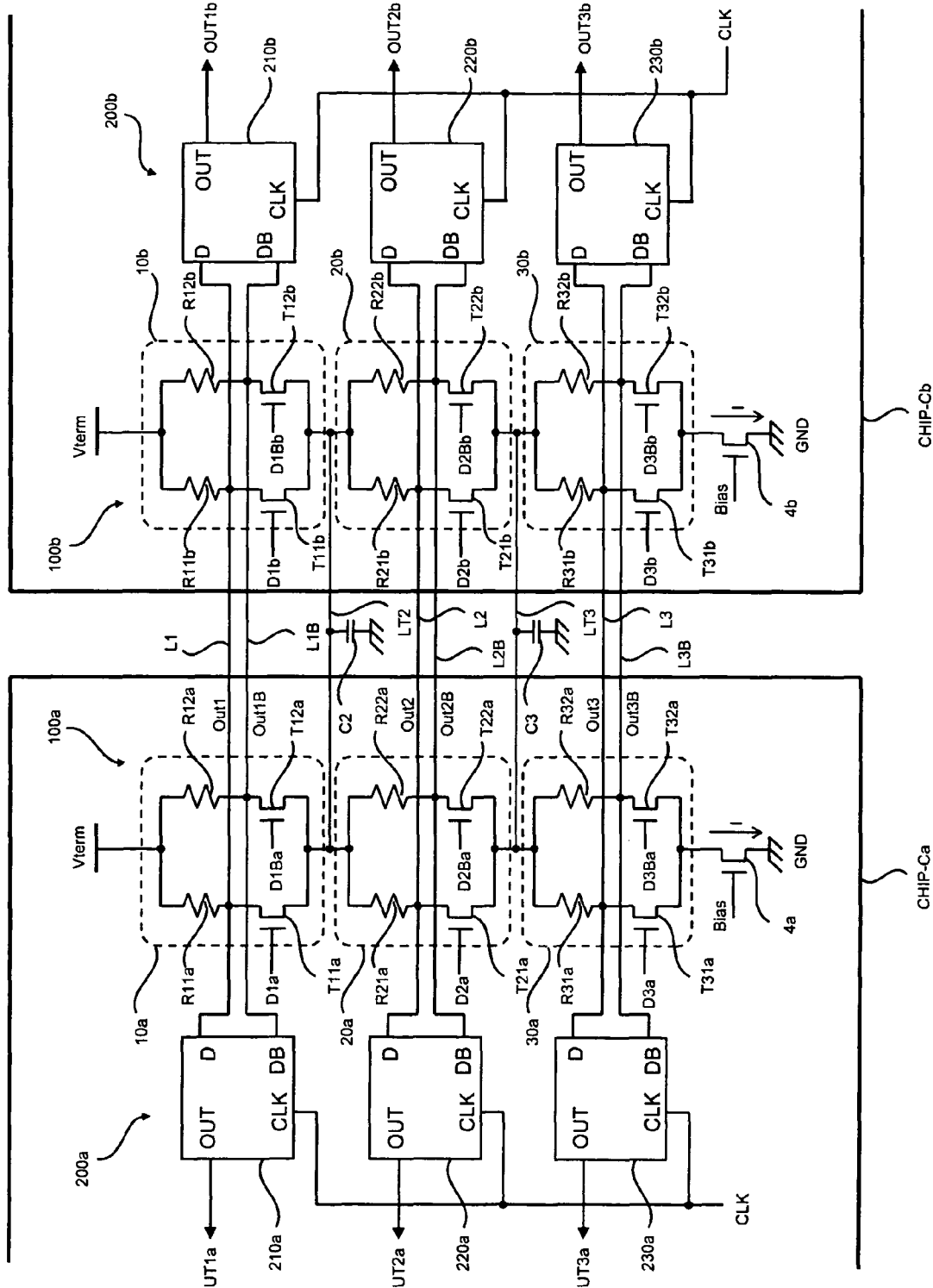
FIG. 6 is a circuit diagram showing still another example of a signal transmission system using the signal transmission circuit according to the first embodiment.

FIG. 6 is a circuit diagram showing still another example of a signal transmission system using the signal transmission circuit according to the first embodiment.

The signal transmission system shown in FIG. 6 is a bidirectional signal transmission system, and includes a semiconductor chip CHIP-Ca and a semiconductor chip CHIP-Cb. The semiconductor chip CHIP-Ca includes an output circuit 100a that supplies a differential signal to each of the signal wirings L1/L1B, L2/L2B, and L3/L3B, and an input circuit 200a that receives a differential signal supplied via the signal wirings L1/L1B, L2/L2B, and L3/L3B. On the other hand, the semiconductor chip CHIP-Cb includes an output circuit 100b that supplies a differential signal to each of the signal wirings L1/L1B, L2/L2B, and L3/L3B, and an input circuit 200b that receives a differential signal supplied via the signal wirings L1/L1B, L2/L2B, and L3/L3B. In this way, the signal wirings L1/L1B, L2/L2B, and L3/L3B are used as bidirectional signal wirings between the semiconductor chips CHIP-Ca and CHIP-Cb.

The output circuits 100a and 100b have the same circuit configurations as that of the signal transmission circuit shown in FIG. 1. The input circuits 200a and 200b have the same circuit configurations as that of the input circuit 200 shown in FIG. 2. As shown in FIG. 6, constituent elements belonging to the semiconductor chip CHIP-Ca are indicated by reference numerals attached with "a" at the end, and constituent elements belonging to the semiconductor chip CHIP-Cb are indicated by reference numerals attached with "b" at the end.

As shown in FIG. 6, a connection point between the differential output circuits 10a and 20a and a connection point between the differential output circuits 10b and 20b are short-circuited via the wiring LT2. Similarly, a connection point between the differential output circuits 20a and 30a and a connection point between the differential output circuits 20b and 30b are short-circuited via the wiring LT3. The capacitors C2 and C3 are connected to the wirings LT2 and LT3, respectively to stabilize a potential. The capacitors C2 and C3 can be omitted.

In the signal transmission system having the above configuration, all input transistors included in the output circuit of the semiconductor chip at a receiving side are fixed to an off state. For example, when the semiconductor chip CHIP-Ca transmits a signal to the semiconductor chip CHIP-Cb, all input transistors T11b, T12b, T21b, T22b, T31b, and T32b are fixed to an off state. On the other hand, when the semiconductor chip CHIP-Cb transmits a signal to the semiconductor chip CHIP-Ca, all input transistors T11a, T12a, T21a, T22a, T31a, and T32a are fixed to an off state. As a result, output resistors included in the output circuit of the semiconductor chip at the receiving side play exactly the same function as that of the terminal resistors RT11, RT12, RT21, RT22, RT31, and RT32 shown in FIG. 5.

As described above, in the signal transmission system shown in FIG. 6, not only a bidirectional transmission can be achieved in lower power consumption, but also the output resistors included in the output circuit of the semiconductor chip at the receiving side function as terminal resistors. Therefore, high-quality signal transmission can be performed using a small number of elements.

While FIG. 6 shows an example that a bidirectional transmission is performed between two semiconductor chips, a bidirectional transmission can be also performed between three or more semiconductor chips.

A second embodiment of the present invention is explained next.

Figure 7A:
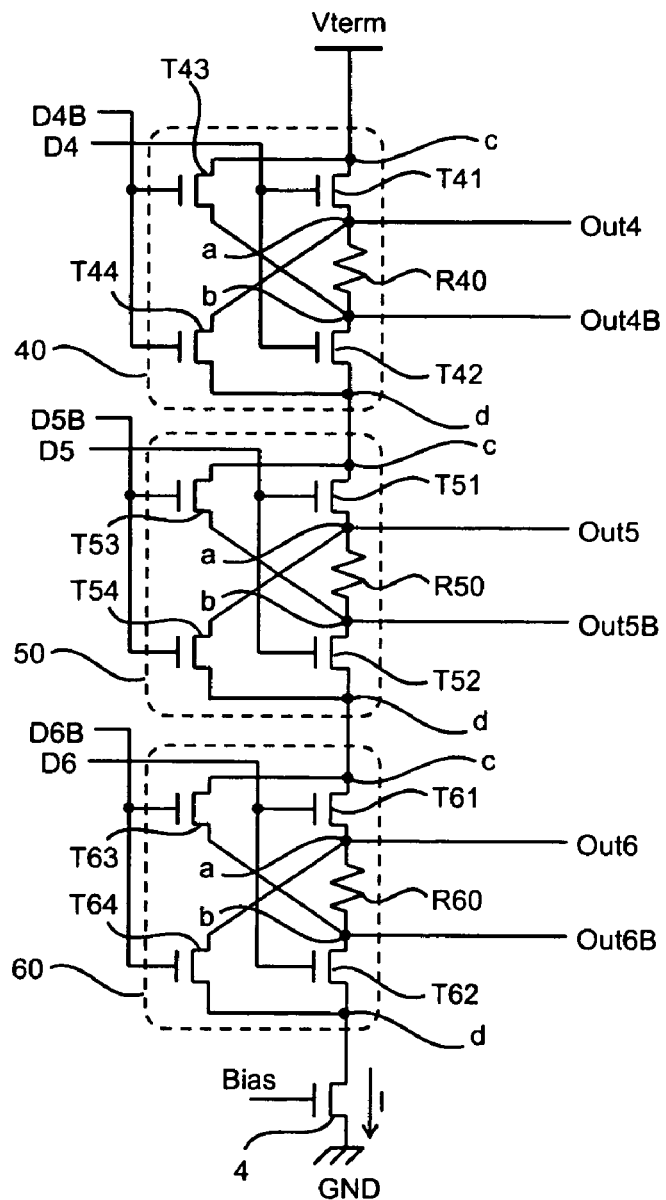
FIG. 7A is a circuit diagram of a signal transmission circuit according to a second embodiment.
Figure 7B:
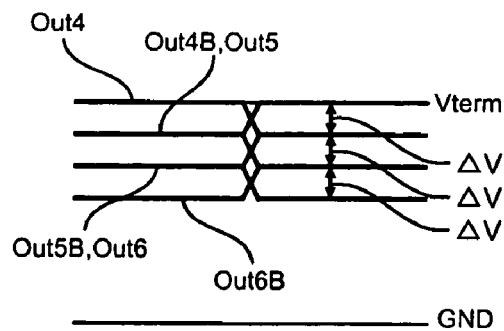
FIG. 7B is an output waveform diagram thereof.

FIG. 7A is a circuit diagram of a signal transmission circuit according to the second embodiment, and FIG. 7B is an output waveform diagram thereof.

As shown in FIG. 7A, the signal transmission circuit according to the second embodiment includes differential output circuits 40, 50, and 60 and the constant current source 4 connected in series between a power source wiring to which the power source potential Vterm is supplied and a power source wiring to which the ground potential GND is supplied. These differential output circuits 40, 50, and 60 have mutually the same circuit configurations. Each differential output circuit includes output nodes 'a' and 'b', a power source node 'c' connected to the Vterm side, and a power source node 'd' connected to the ground potential GND side. The output node 'a' outputs one complementary output signal (Out4, Out5, Out6), and the output node 'b' outputs the other complementary output signal (Out4B, Out5B, Out6B).

The differential output circuits 40, 50, and 60 include output resistors R40, R50, and R60 each connected between the output nodes 'a' and 'b', input transistors T41, T51, and T61 each connected between the output node 'a' and the power source node 'c', input transistors T42, T52, and T62 each connected between the output node 'b' and the power source node 'd', input transistors T43, T53, and T63 each connected between the output node 'b' and the power source node 'c', and input transistors T44, T54, and T64 each connected between the output node 'a' and the power source node 'd'. These input transistors are all N-channel MOS transistors.

In the differential output circuit 40, one complementary input signal (D4) is supplied to gate electrodes of the input transistors T41 and T42, and the other complementary input signal (D4B) is supplied to gate electrodes of the input transistors T43 and T44. In the differential output circuit 50, one complementary input signal (D5) is supplied to gate electrodes of the input transistors T51 and T52, and the other complementary input signal (D5B) is supplied to gate electrodes of the input transistors T53 and T54. In the differential output circuit 60, one complementary input signal (D6) is supplied to gate electrodes of the input transistors T61 and T62, and the other complementary input signal (D6B) is supplied to gate electrodes of the input transistors T63 and T64.

With the above arrangement, in the differential output circuit 40, when the input transistors T41 and T42 are turned on, the current I flows from the output node 'a' toward the output node 'b'. Therefore, the output signal Out4 becomes at a high level, and Out4B becomes at a low level. On the other hand, when the input transistors T43 and T44 are turned on, the current I flows from the output node 'b' toward the output node 'a'. Therefore, the output signal Out4 becomes at a low level, and Out4B becomes at a high level. Other differential output circuits 50 and 60 also operate in a similar manner.

Also in the second embodiment, one constant current source 4 is shared by the three differential output circuits 40, 50, and 60. That is, the current I used to operate the differential output circuit 40 is used again to operate the differential output circuit 50. Further, the current I used to operate the differential output circuit 50 is used again to operate the differential output circuit 60.

As a result, as shown in FIG. 7B, the signals Out4/Out4B, Out5/Out5B, and Out6/Out6B output from the differential output circuits 40, 50, and 60 become at the same potentials as those of the output signals Out1/Out1B, Out2/Out2B, and Out3/Out3B, respectively shown in FIG. 1B.

As described above, the signal transmission circuit according to the second embodiment can also achieve the same effect as that obtained by the signal transmission circuit according to the first embodiment. Further, according to the second embodiment, each of the differential output circuits 40, 50, and 60 includes one output resistor. Therefore, the number of resistor elements can be reduced. Further, the current I flows through the same output resistor regardless of a logic level of the output signal. Therefore, a waveform during a high level output and a waveform during a low level output can keep a high symmetry.

Figure 8:
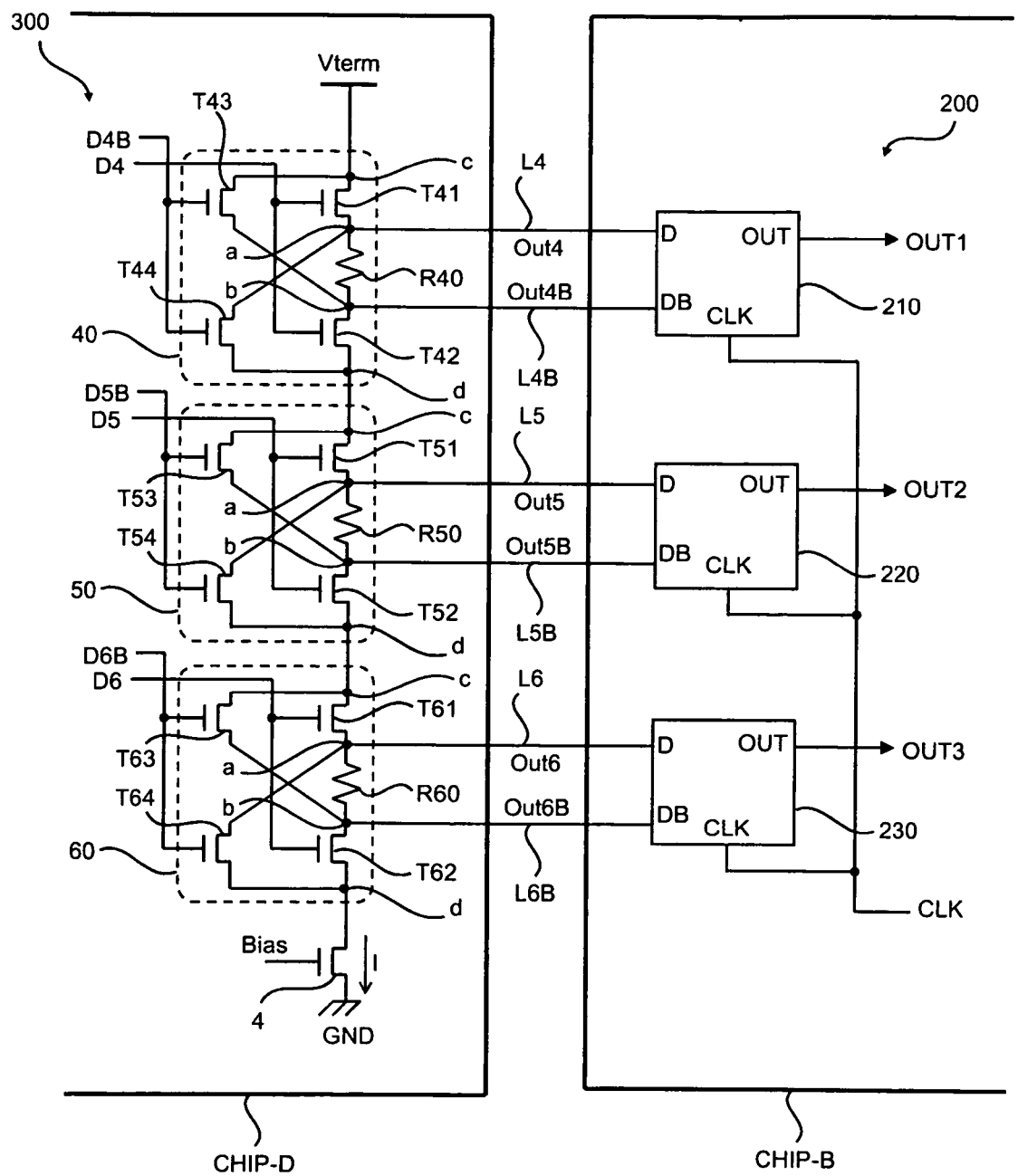
FIG. 8 is a circuit diagram showing one example of a signal transmission system using the signal transmission circuit according to the second embodiment.

FIG. 8 is a circuit diagram showing one example of a signal transmission system using the signal transmission circuit according to the second embodiment.

The signal transmission system shown in FIG. 8 includes three pairs of the signal wirings L4/L4B, L5/L5B, and L6/L6B, an output circuit 300 that supplies differential signals to these signal wirings, and the input circuit 200 that receives differential signals via these signal wirings. The output circuit 300 is provided in a semiconductor chip CHIP-D, and the input circuit 200 is provided in the separate semiconductor chip CHIP-B. Therefore, the signal wirings L4/L4B, L5/L5B, and L6/L6B are external wirings connecting between the semiconductor chip CHIP-D and the semiconductor chip CHIP-B. The output circuit 300 provided in the semiconductor chip CHIP-D has the same circuit configuration as that of the signal transmission circuit shown in FIG. 7. The input circuit 200 provided in the semiconductor chip CHIP-B has the same circuit configuration as that of the input circuit 200 shown in FIG. 2.

Based on the configuration described above, the signal transmission system according to the second embodiment can achieve the same effect as that of the signal transmission system shown in FIG. 2.

Figure 9:
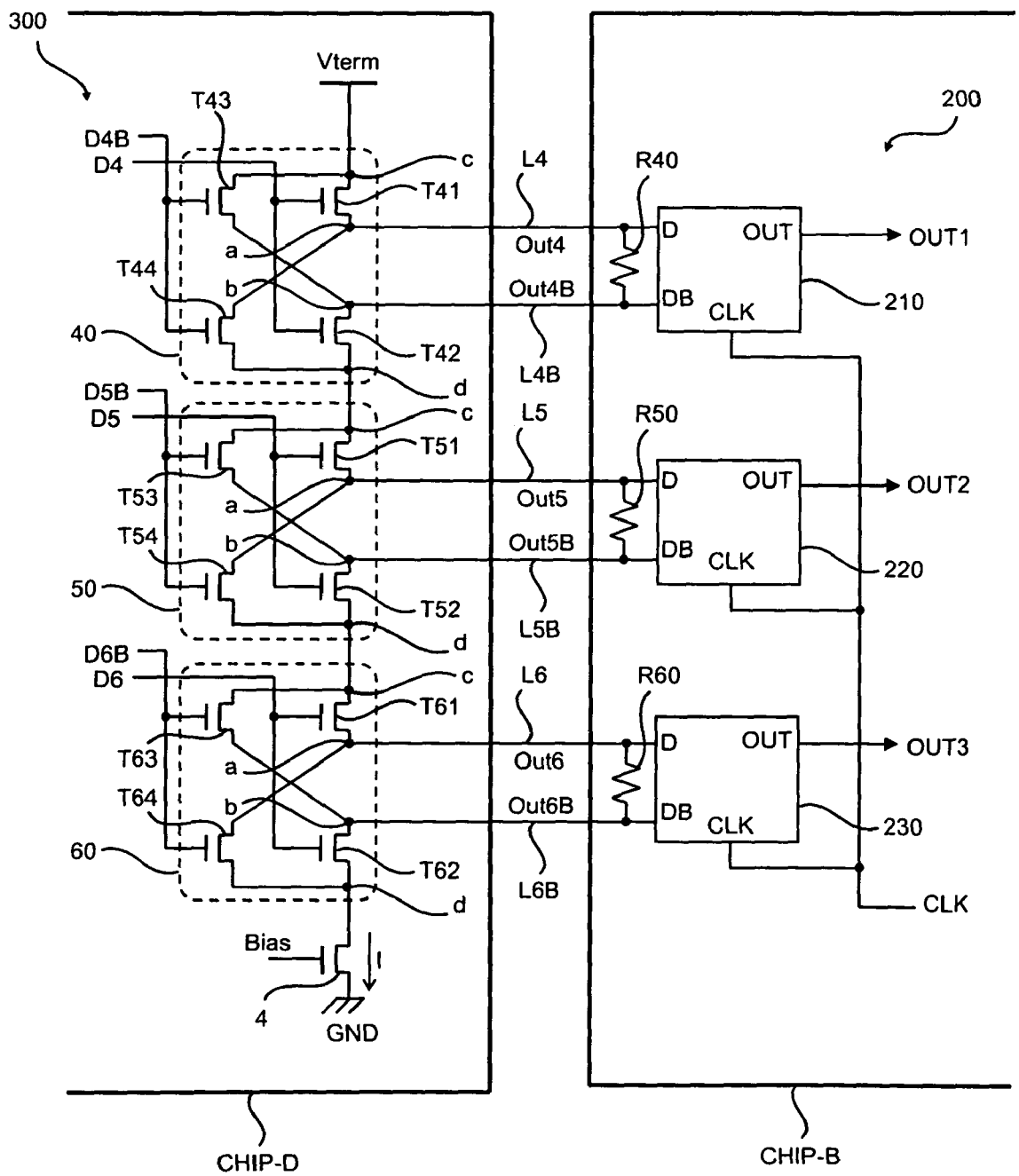
FIG. 9 is a circuit configuration diagram showing another example of a signal transmission system using the signal transmission circuit according to the second embodiment.

FIG. 9 is a circuit configuration diagram showing another example of a signal transmission system using the signal transmission circuit according to the second embodiment.

The signal transmission system shown in FIG. 9 is different from the signal transmission system shown in FIG. 8 in that the output resistors R40, R50, and R60 are shifted from the output circuit 300 to the input circuit 200. Other features of the signal transmission system shown in FIG. 9 are the same as those of the signal transmission system shown in FIG. 8, and therefore identical elements are assigned with like reference numerals, and redundant explanations thereof will be omitted.

According to the configuration described above, the output resistors R40, R50, and R60 also function as terminal resistors. Therefore, the signal quality can be improved without increasing the number of elements. In this example, while the output resistors R40, R50, and R60 are provided inside the semiconductor chip CHIP-B, these output resistors can be provided at the outside of the semiconductor chip CHIP-B.

Although not shown, the signal transmission circuit according to the second embodiment can also configure a bidirectional signal transmission system as shown in FIG. 6.

A third embodiment of the present invention is explained next.

Figure 10:
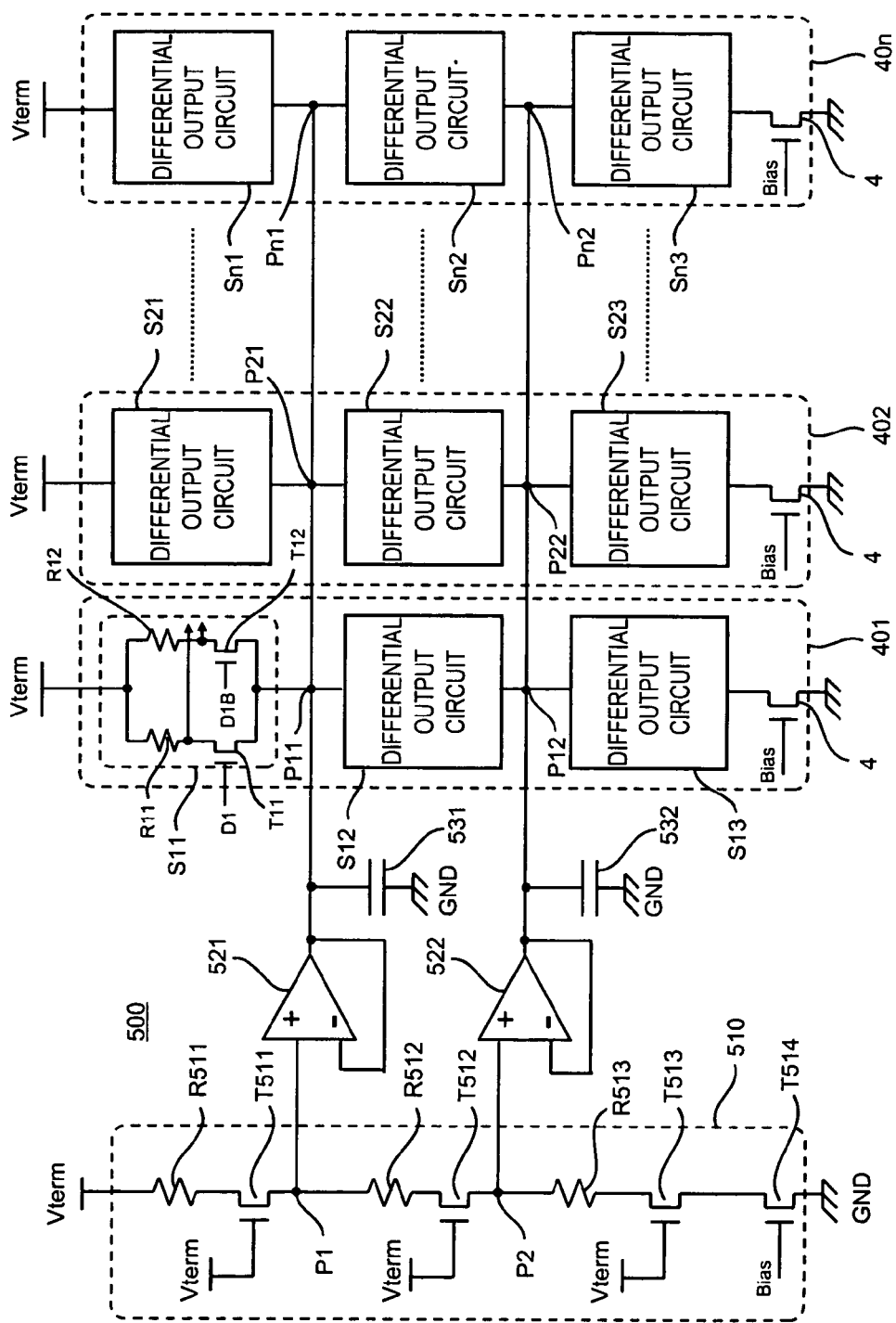
FIG. 10 is a circuit diagram showing a signal transmission circuit according to a third embodiment.

FIG. 10 is a circuit diagram showing a signal transmission circuit according to the third embodiment.

The third embodiment is suitable for a signal transmission circuit having a large number of bits in an output signal. As shown in FIG. 10, the signal transmission circuit according to the third embodiment includes series circuits 401 to 40n. The connection point between differential output circuits included in different series circuits are short-circuited. In this example, each of the series circuits 401 to 40n has the same circuit configuration as that of the signal transmission circuit shown in FIG. 1A. Therefore, differential output circuits S11 to S13 shown in FIG. 10 correspond to the differential output circuits 10, 20, and 30 shown in FIG. 1A. Accordingly, a signal of 3×n bits can be output.

As described above, when plural differential output circuits are connected in series like in the present invention, center levels of output signals change. Therefore, when the number of bits of an output signal is large, it is difficult to arrange differential output circuits of whole bits in one series circuit. In this case, one series circuit can be configured using differential output circuits of a predetermined number of bits (three bits in the example shown in FIG. 10), and these differential output circuits are used in parallel, like in the third embodiment.

As shown in FIG. 10, the signal transmission circuit according to the third embodiment further includes a stabilizing circuit 500 that stabilizes potentials of connection points P11 to Pn2 of differential output circuits S11 to Sn3. The stabilizing circuit 500 includes a replica circuit 510 having substantially the same circuit configuration as that of a conduction path of series circuits 401 to 40n, buffer circuits 521 and 522 that buffer an output of the replica circuit 510, and capacitors 531 and 532 that stabilize outputs of the buffer circuits 521 and 522.

The replica circuit 510 includes dummy resistors R511 to R513, and dummy transistors T511 to T514. The dummy resistor R511 and the dummy transistor T511 correspond to output resistors and input transistors included in the differential output circuits S11, S21, . . . Sn1. Similarly, the dummy resistor R512 and the dummy transistor T512 correspond to output resistors and input transistors included in the differential output circuits S12, S22, . . . Sn2, and the dummy resistor R513 and the dummy transistor T513 correspond to output resistors and input transistors included in the differential output circuits S13, S23, . . . Sn3. The power source potential Vterm is supplied to gate electrodes of the dummy transistors T511 to T513, so that the dummy transistors T511 to T513 are equivalent to the input transistors which are on.

The dummy transistor T514 corresponds to the constant current source 4 included in each of the series circuits 401 to 40n. The bias voltage Bias is supplied to a gate electrode of the dummy transistor T514, so that the dummy transistor T514 is equivalent to the constant current source 4.

Based on the circuit configuration described above, a level of the output node P1 of the replica circuit 510 coincides with levels of connection points P11, P21, . . . Pn1 between the differential output circuits S11, S21, . . . Sn1 and the differential output circuits S12, S22, . . . Sn2, respectively. Further, a level of the output node P2 of the replica circuit 510 coincides with levels of connection points P12, P22, . . . Pn2 between the differential output circuits S12, S22, . . . Sn2 and the differential output circuits S13, S23, . . . Sn3, respectively.

When the output node P1 (P2) is directly connected to the connection points P11, P21, . . . Pn1 (P12, P22, . . . Pn2), the driving capacity of the replica circuit 510 cannot often sufficiently stabilize levels of these connection points. Therefore, in the third embodiment, an output of the buffer circuit 521 is supplied to the connection points P11, P21, . . . Pn1, and an output of the buffer circuit 522 is supplied to the connection points P12, P22, . . . Pn2, by using the buffer circuits 521 and 522 that buffer an output of the replica circuit 510 and using the capacitors 531 and 532 that stabilize outputs of the buffer circuits 521 and 522.

The buffer circuits 521 and 522 include operating amplifiers connected by a voltage follower type. The capacitors 531 and 532 have sufficient capacitance to stabilize a potential. Accordingly, a potential generated by the replica circuit 510 is supplied with large driving ability to the connection points P11, P21, . . . Pn1 and the connection points P12, P22, . . . Pn2. As a result, levels of these connection points can be sufficiently stabilized.

As described above, the signal transmission circuit according to the third embodiment is suitable when the number of bits of an output signal is large. Further potentials of the connection points between the differential output circuits are stabilized. Therefore, complementary signals of a small variation and high-quality can be generated.

Figure 11:
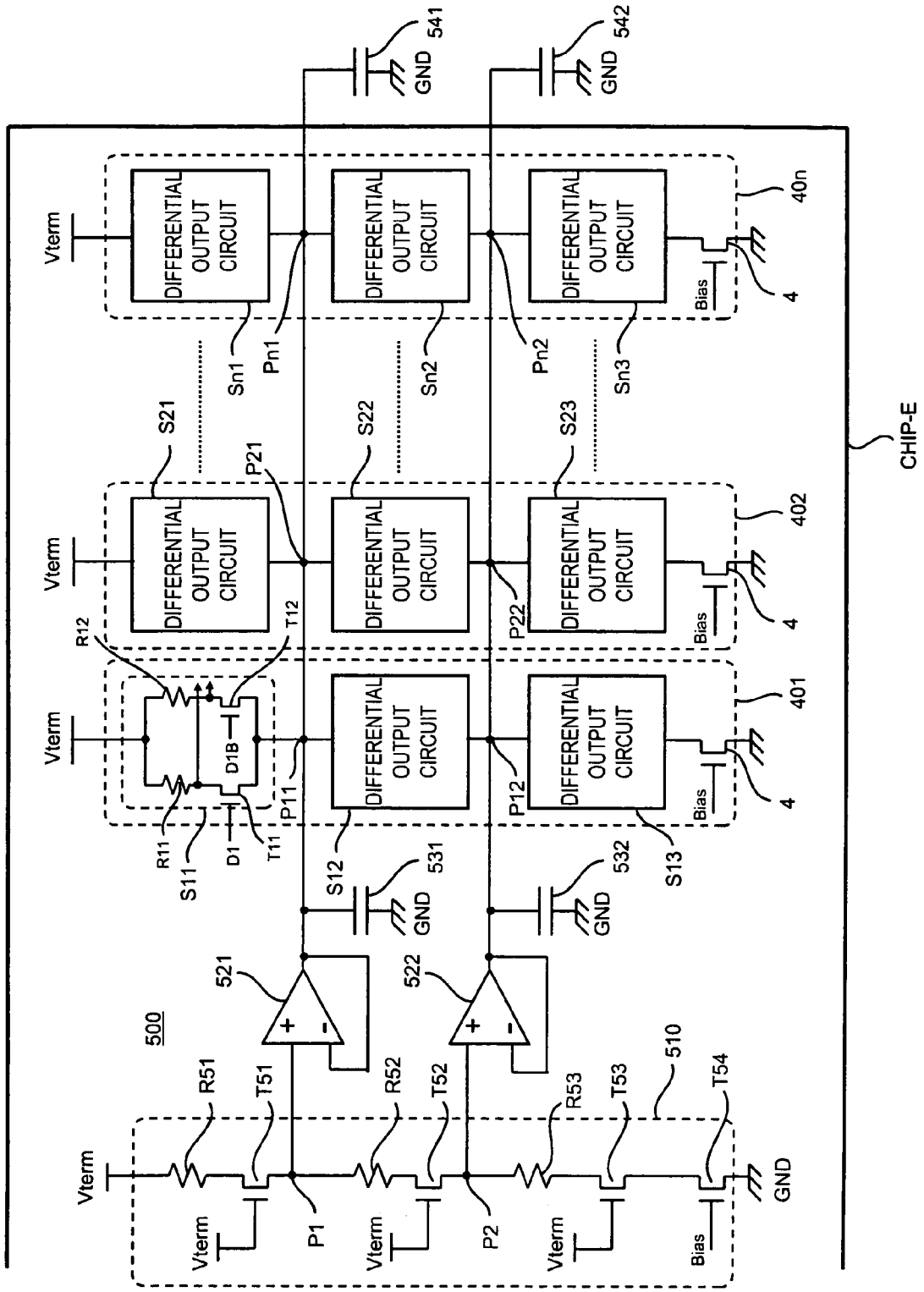
FIG. 11 is a circuit diagram showing a modification of the signal transmission circuit according to the third embodiment.

FIG. 11 is a circuit diagram showing a modification of the signal transmission circuit according to the third embodiment.

In the example shown in FIG. 11, capacitors 541 and 542 are added to the outside of a semiconductor chip CHIP-E. Other features are the same as those of the signal transmission circuit shown in FIG. 10. Because the capacitors 541 and 542 are provided at the outside of the semiconductor chip CHIP-E, larger capacitance can be obtained. Therefore, levels of the connection points P11, P21, . . . Pn1 and levels of the connection points P12, P22, . . . Pn2 can be more stabilized.

In FIG. 10 and FIG. 11, while each of the series circuits 401 to 40n has the same circuit configuration as that of the signal transmission circuit shown in FIG. 1A, each of the series circuits 401 to 40n can have the same circuit configuration as that of the signal transmission circuit shown in FIG. 7A. In the third embodiment, while the plural series circuits 401 to 40n are used in parallel, this is not essential and one stabilizing circuit 500 can be allocated to one series circuit.

Furthermore, use of the stabilizing circuit 500 is not essential in the present invention, and the stabilizing circuit 500 can be omitted. Even in this case, because the corresponding connection points P11, P21, . . . Pn1 are also short-circuited, signal levels within the series circuits 401 to 40n can be mutually stabilized.

A fourth embodiment of the present invention is explained next.

In the fourth embodiment, the present invention is applied to a differential input circuit. The differential input circuit and a differential output circuit are the same in that these circuits receive input signals of a complementary format and output signals of a complementary format. Therefore, these circuits are made different for the sake of convenience. However, usually, a differential output circuit is that of a type converting an internal signal of large amplitude into an external signal of small amplitude. Meanwhile, a differential input circuit is that of a type converting an external signal of small amplitude into an internal signal of large amplitude. In the first to third embodiments, each differential circuit is a type of converting complementary signals of large amplitude into complementary signals of small amplitude. Therefore, these circuits are called "differential output circuits". On the other hand, a signal transmission circuit according to the fourth embodiment is a differential circuit of a type converting complementary signal of small amplitude into complementary signals of large amplitude. Therefore, in the following explanations, differential circuits included in the signal transmission circuit are called "differential input circuits".

Figure 12A:
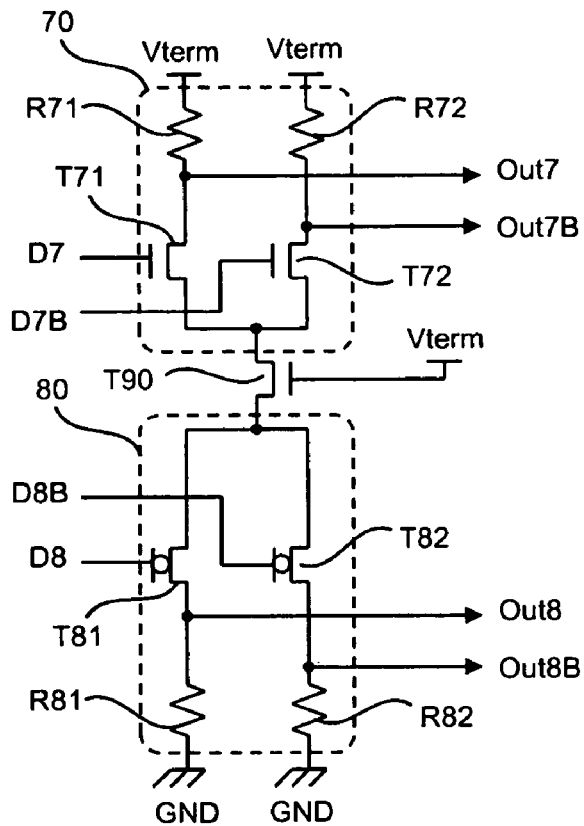
FIG. 12A is a circuit diagram of a signal transmission circuit according to a fourth embodiment.
Figure 12B:
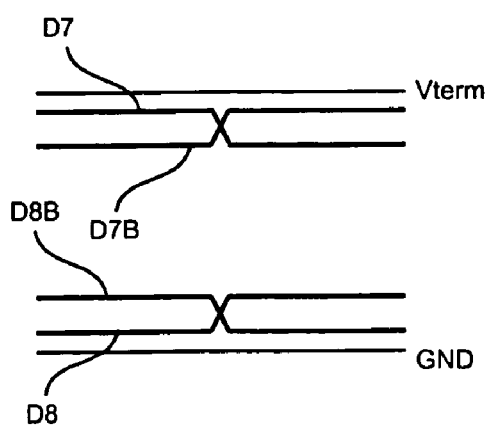
FIG. 12B is a waveform diagram of an output signal.

FIG. 12A is a circuit diagram of a signal transmission circuit according to the fourth embodiment, and FIG. 12B is a waveform diagram of an output signal.

As shown in FIG. 12A, the signal transmission circuit according to the fourth embodiment includes differential input circuits 70 and 80 connected in series between a power source wiring to which the power source potential Vterm is supplied and a power source wiring to which the ground potential GND is supplied, and a center transistor T90 connected between the differential input circuits 70 and 80. The differential input circuit 70 and the differential input circuit 80 have mutually different circuit configurations. The center transistor T90 is an N-channel MOS transistor, and the power source potential Vterm is supplied to a gate electrode of this transistor.

Specifically, the differential input circuit 70 includes an output resistor R71 and an input transistor T71, and an output resistor R72 and an input transistor T72, connected in series between the power source potential Vterm and the center transistor T90, respectively. One complementary input signal (D7) is supplied to a gate electrode of the input transistor T71, and the other complementary input signal (D7B) is supplied to a gate electrode of the input transistor T72. One complementary output signal (Out7) is output from a connection point between the input transistor T71 and the output resistor R71, and the other complementary output signal (Out7B) is output from a connection point between the input transistor T72 and the output resistor R72. The input transistors T71 and T72 included in the differential input circuit 70 are N-channel MOS transistors.

On the other hand, the differential input circuit 80 includes an input transistor T81 and an output resistor R81, and an input transistor T82 and an output resistor R82, connected in series between the center transistor T90 and the ground potential GND, respectively. One complementary input signal (D8) is supplied to a gate electrode of the input transistor T81, and the other complementary input signal (D8B) is supplied to a gate electrode of the input transistor T82. One complementary output signal (Out8) is output from a connection point between the input transistor T81 and the output resistor R81, and the other complementary output signal (Out8B) is output from a connection point between the input transistor T82 and the output resistor R82. The input transistors T81 and T82 included in the differential input circuit 80 are P-channel MOS transistors.

As shown in FIG. 12B, the complementary input signals D7/D7B are signals of small amplitude swinging near the power source potential Vterm. On the other hand, the complementary input signals D8/D8B are signals of small amplitude swinging near the ground potential GND. Preferably, these input signals D7/D7B and D8/D8B are external signals supplied from the outside of the semiconductor chip.

Figure 12C:
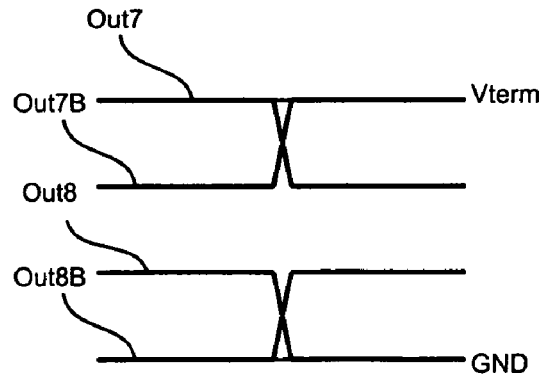

When these input signals are supplied, the complementary output signals Out7/Out7B become signals of large amplitude swinging near the power source potential Vterm, and the complementary output signals Out8/Out8B become signals of large amplitude swinging near the ground potential GND, as shown in FIG. 12C. Preferably, these output signals Out7/Out7B and Out8/Out8B are internal signals supplied to the inside of the semiconductor chip.

As described above, in the signal transmission circuit according to the fourth embodiment, the differential input circuit 70 using the N-channel MOS transistors is connected in series with the differential input circuit 80 using the P-channel MOS transistors. Therefore, an input signal of small amplitude can be converted into an output signal of large amplitude. Consequently, this signal transmission circuit is suitable for use as an input receiver of a differential transmission system. Further, because the sensor transistor T90 is connected between the differential input circuit 70 and the differential input circuit 80, influence of noise between the differential input circuits 70 and 80 can be reduced.

Figure 13:
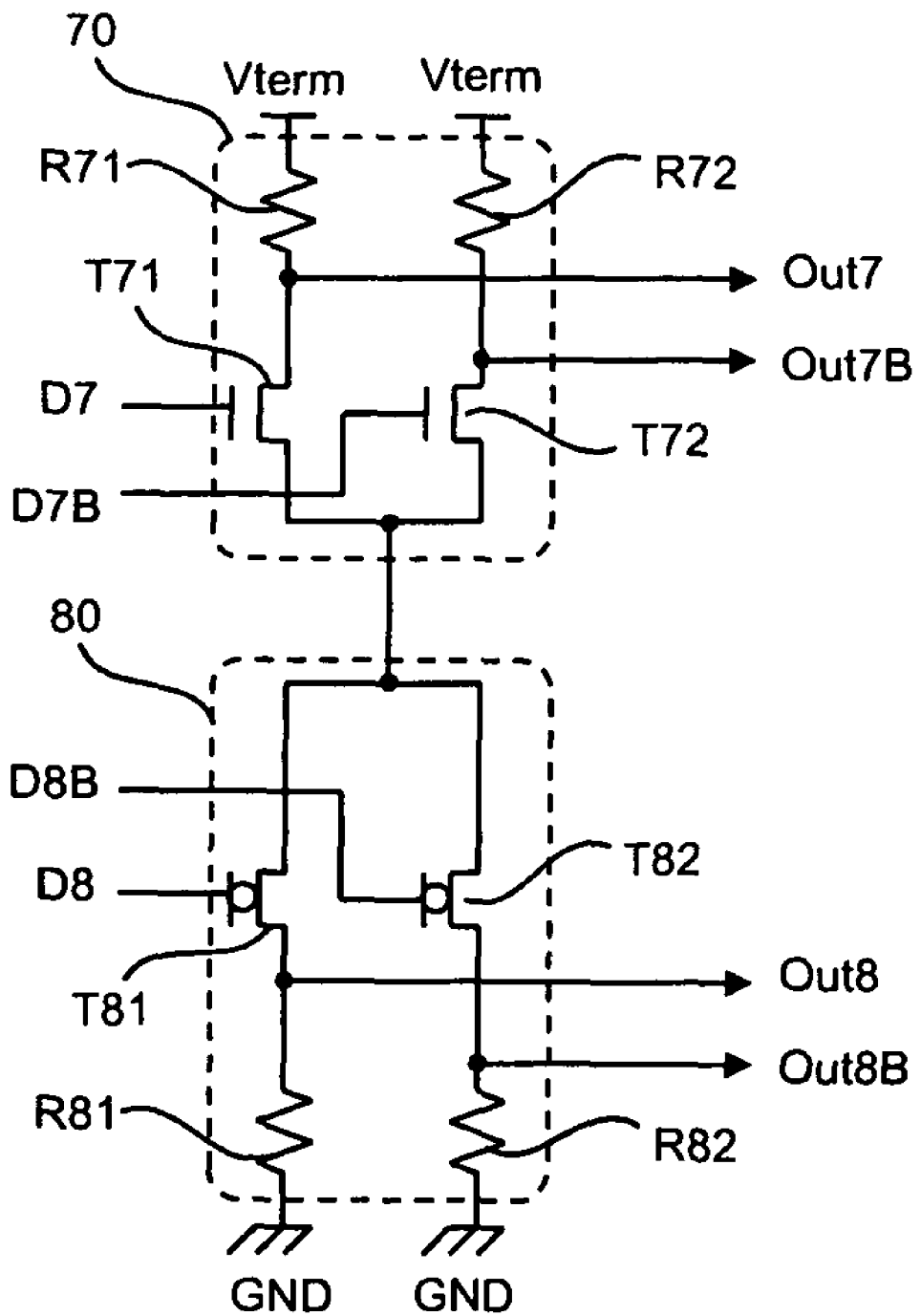
FIG. 13 is a circuit diagram showing a modification of the signal transmission circuit according to the fourth embodiment.

FIG. 13 is a circuit diagram showing a modification of the signal transmission circuit according to the fourth embodiment.

The circuit shown in FIG. 13 has the center transistor T90 omitted from the signal transmission circuit shown in FIG. 12. Even when the center transistor T90 is omitted, a level of an output signal is determined by a resistance of an output resistor and an amount of a current flowing through the output resistor. Therefore, an output characteristic substantially the same as that of the circuit shown in FIG. 12 can be obtained. According to this circuit configuration, the number of elements can be reduced, and potential differences of the input signals D7/D7B and D8/D8B from the center level increases. Therefore, the driving ability of the input transistors T71, T72, T81, and T82 can be improved.

Figure 14:
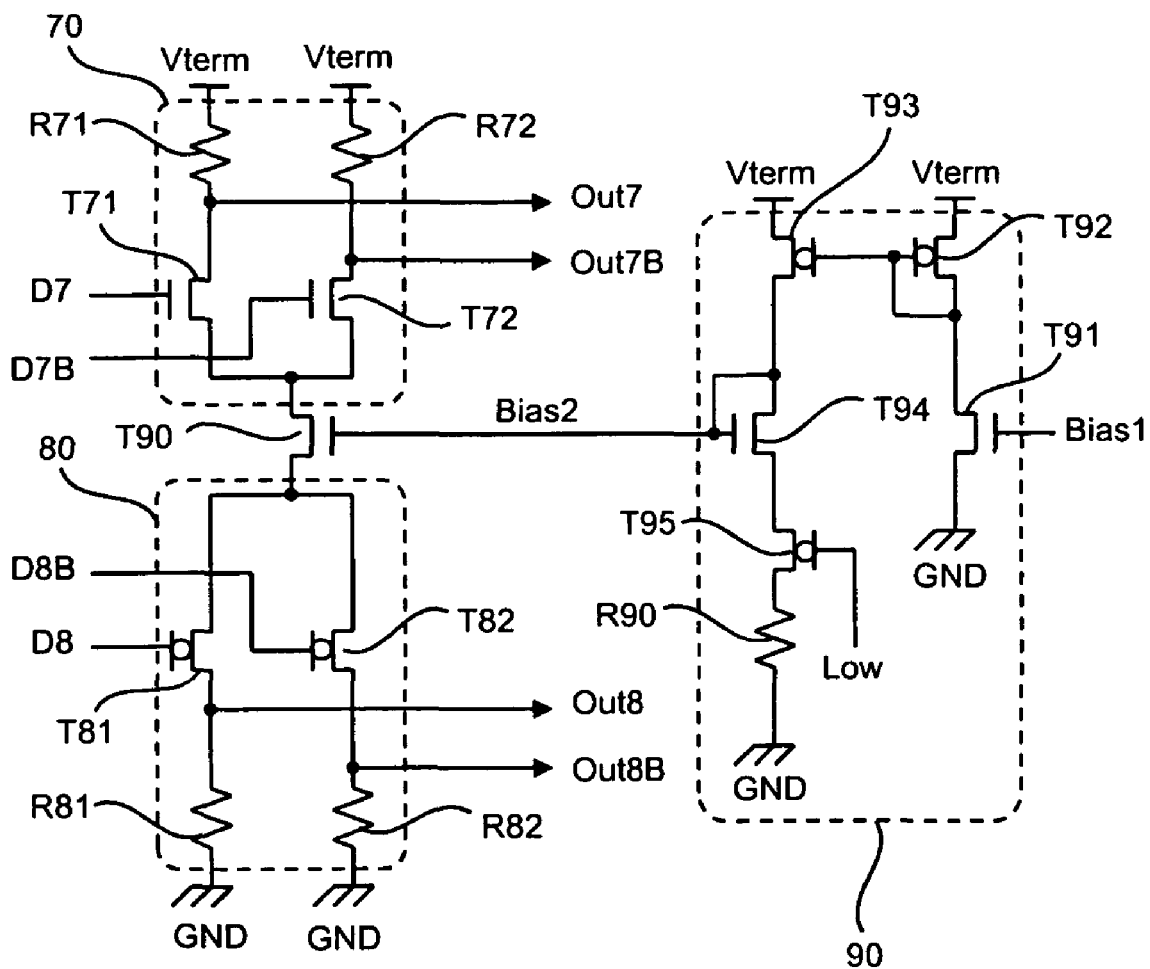
FIG. 14 is a circuit diagram showing another modification of the signal transmission circuit according to the fourth embodiment.

FIG. 14 is a circuit diagram showing another modification of the signal transmission circuit according to the fourth embodiment.

The circuit shown in FIG. 14 uses the center transistor T90 for a constant current source. That is, a bias generating circuit 90 is added, and a bias voltage Bias2 output from the bias generating circuit 90 is supplied to a gate electrode of the center transistor T90.

The bias generating circuit 90 includes a transistor T91 to which a bias voltage Bias1 is supplied, transistors T92 and T93 constituting a current mirror circuit, a transistor T94 constituting a current mirror circuit together with the center transistor T90, an adjusting transistor T95, and a resistor R90. As shown in FIG. 14, the transistors T91 and T92 are connected in series in this order between the ground potential GND and the power source potential Vterm. The transistors T93 to T95 and the resistor R90 are connected in series in this order between the power source potential Vterm and the ground potential GND. The transistors T91 and T94 are N-channel MOS transistors. The transistors T92, T93, and T95 are P-channel MOS transistors.

An adjusting signal Low is supplied to a gate electrode of the adjusting transistor T95. A potential of the adjusting signal Low is equal to a lower potential of the input signals D8/D8B, and can be adjusted by an internal circuit (not shown). Based on this configuration, a current flowing through the center transistor T90 becomes a constant current. A potential difference between the output signals Out7/Out7B and a potential difference between the output signals Out8/Out8B become substantially constant. Therefore, better signal quality can be achieved.

It is apparent that the present invention is not limited to the above embodiments, but may be modified and changed without departing from the scope and spirit of the invention.

For example, three differential circuits (differential output circuits) are connected in series in the first to third embodiments, and two differential circuits (differential input circuits) are connected in series in the fourth embodiment. However, the numbers of differential circuits capable of being connected in series are not limited thereto. Therefore, four or more differential circuits can be connected in series.

Figure 15A:
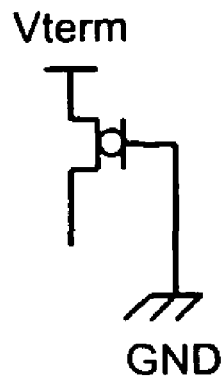
FIGS. 15A to 15D are circuit diagrams showing modifications of a resistor included in a differential circuit, each of FIGS. 15A and 15B is a circuit diagram showing modification of a resistor of which one end is connected to the power source potential Vterm, and each of FIGS. 15C and 15D is a circuit diagram showing modification of a resistor of which one end is connected to the ground potential GND.
Figure 15B:
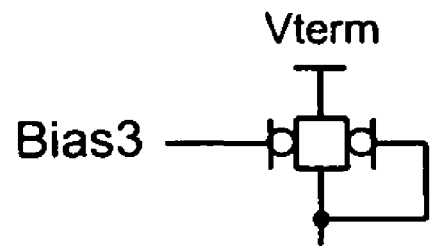

Further, a resistor included in a differential circuit can be configured using other elements such as transistors or circuits. For example, for a resistor of which one end is connected to the power source potential Vterm, a P-channel MOS transistor having a gate grounded can be used, as shown in FIG. 15A. Alternatively, a parallel circuit consists of a P-channel MOS transistor connected in diode and a P-channel MOS transistor of which gate electrode is supplied with a bias voltage Bias3 can be used, as shown in FIG. 15B.

Figure 15C:
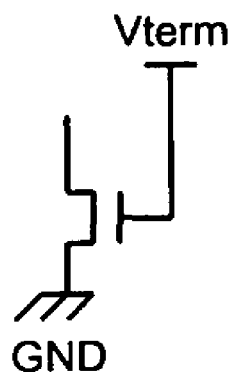
Figure 15D:
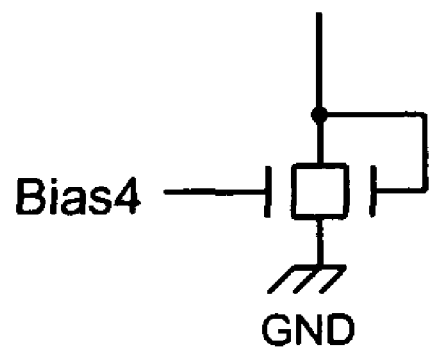

Similarly, for a resistor of which one end is connected to the ground potential GND, an N-channel MOS transistor of which gate electrode is connected to the power source potential Vterm can be used, as shown in FIG. 15C. Alternatively, a parallel circuit consists of an N-channel MOS transistor connected in diode and an N-channel MOS transistor of which gate electrode is supplied with a bias voltage Bias4 can be used, as shown in FIG. 15D.

Further, a transistor included in a differential circuit is not limited to a MOS transistor as explained in the above embodiments, and other switchable elements or circuits can be used.

What is claimed is:

1. A signal transmission circuit comprising:
   first and second power source wirings;
   a plurality of differential circuits connected in series between the first and second power source wirings; and
   a stabilizing circuit that stabilizes a potential of, a connection point between the differential circuits,
   wherein the stabilizing circuit includes a replica circuit having substantially the same circuit configuration as that of a conduction path of the differential circuits, and a potential generated by the replica circuit is supplied to the connection point.

2. The signal transmission circuit as claimed in claim 1, wherein the stabilizing circuit further includes a buffer circuit that buffers an output of the replica circuit, and a capacitor that stabilizes an output of the buffer circuit, and the output of the buffer circuit is supplied to the connection point.

3. The signal transmission circuit as claimed in claim 1, further comprising a constant current source, wherein
the differential circuits have mutually the same circuit configurations, and the constant current source is connected between a series circuit constituted of the differential circuits and the first power source wiring.

4. The signal transmission circuit as claimed in claim 1, wherein the differential circuits include first and second differential circuits having mutually different circuit configurations.

5. The signal transmission circuit as claimed in claim 4, wherein the first differential circuit includes N-channel MOS transistors, and the second differential circuit includes P-channel MOS transistors.

6. The signal transmission circuit as claimed in claim 4, further comprising a constant current source connected between the first differential circuit and the second differential circuit.

7. A signal transmission circuit comprising:
first and second power source wirings; and
a plurality of differential circuits connected in series between the first and second power source wirings,
wherein a plurality of series circuits each constituted of the plurality of differential circuits are provided, and connection points of the differential circuits included in different series circuits are short-circuited.

8. The signal transmission circuit as claimed in claim 7, further comprising a constant current source,
wherein the differential circuits have mutually the same circuit configurations, and the constant current source is connected between a series circuit constituted of the differential circuits and the first power source wiring.

9. The signal transmission circuit as claimed in claim 7, wherein the differential circuits include first and second differential circuits having mutually different circuit configurations.

10. The signal transmission circuit as claimed in claim 9, wherein the first differential circuit includes N-channel MOS transistors, and the second differential circuit includes P-channel MOS transistors.

11. The signal transmission circuit as claimed in claim 9, further comprising a constant current source connected between the first differential circuit and the second differential circuit.

12. A signal transmission system comprising:
a plurality of pairs of signal wirings;
an output circuit supplying a differential signal to each of the pairs of signal wirings; and
an input circuit receiving the differential signals via the pairs of signal wirings,
wherein the output circuit includes first and second power source wirings, and a plurality of differential output circuits connected in series between the first and second power source wirings,
wherein the input circuit includes a plurality of differential input circuits each corresponding to an associated one of the differential output circuits,
wherein the output circuit is provided in a first semiconductor chip, and the input circuit is provided in a second semiconductor chip different from the first semiconductor chip, and
wherein each of the differential output circuits includes:
first and second output nodes connected respectively to first and second signal wirings constituting corresponding one of the signal wiring pairs;
a first power source node connected to the first power source wiring side;
a second power source node connected to the second power source wiring side;
a first switch connected between the first output node and the first power source node;
a second switch connected between the second output node and the second power source node;
a third switch connected between the second output node and the first power source node;
a fourth switch connected between the first output node and the second power source node; and
an output resistor connected between the first output node and the second output node.

13. The signal transmission system as claimed in claim 12, wherein the output resistor is provided in the second semiconductor chip.

14. The signal transmission system as claimed in claim 12, further comprising a plurality of terminal resistors each connected between an associated one of the pairs of signal wirings.

15. The signal transmission system as claimed in claim 12, further comprising a plurality of terminal resistors connected respectively between the pairs of signal wirings and a corresponding connection point of the differential output circuits.

16. A signal transmission system comprising:
a plurality of pairs of signal wirings
an output circuit supplying a differential signal to each of the pairs of signal wirings; and
an input circuit receiving the differential signals via the pairs of signal wirings,
wherein the output circuit includes first and second power source wirings, and a plurality of differential output circuits connected in series between the first and second power source wirings,
wherein the input circuit includes a plurality of differential input circuits each corresponds to an associated one of the differential output circuits,
wherein the output circuit includes a first output circuit that is provided in a first semiconductor chip and supplies a differential signal to each of the pairs of signal wirings, and a second output circuit that is provided in a second semiconductor chip different from the first semiconductor chip and supplies a differential signal to each of the pairs of signal wirings, and
wherein the input circuit includes a first input circuit that is provided in the first semiconductor chip and receives the differential signal supplied from the second output circuit via the pairs of signal wirings, and a second input circuit that is provided in the second semiconductor chip and receives the differential signal supplied from the first output circuit via the pairs of signal wirings.

17. The signal transmission system as claimed in claim 16, further comprising a short-circuit wiring that short-circuits between a connection point of the differential output circuits included in the first output circuit and a connection point of the differential output circuits included in the second output circuit.

18. The signal transmission system as claimed in claim 17, further comprising a capacitor connected to the short-circuit wiring.

19. The signal transmission system as claimed in claim 16, further comprising a plurality of terminal resistors each connected between an associated one of the pairs of signal wirings.

20. The signal transmission system as claimed in claim 16, further comprising a plurality of terminal resistors connected respectively between the pairs of signal wirings and a corresponding connection point of the differential output circuits.

* * * * *